United States Patent [19]

Shang-Wen

[11] Patent Number: 5,029,296
[45] Date of Patent: Jul. 2, 1991

[54] ELECTRICAL GAUGE STRUCTURE

[76] Inventor: Chang Shang-Wen, 2Fl., No.1, Alley 16, Lane 235, Pao-Chiao Rd., Shin Tien, Taipei, Taiwan

[21] Appl. No.: 426,658

[22] Filed: Oct. 26, 1989

[51] Int. Cl.$^5$ .............................................. G01R 1/04
[52] U.S. Cl. .................................. 324/156; 73/866.1; 324/149; 324/72.5
[58] Field of Search ............... 324/156, 157, 149, 133, 324/72.5, 555, 556; 73/431, 866.5; D10/78, 79, 80, 75

[56] References Cited

U.S. PATENT DOCUMENTS

| | | | |
|---|---|---|---|
| 2,586,203 | 2/1952 | Boyle | 324/149 X |
| 2,791,748 | 5/1957 | Mitchell | 324/156 X |
| 2,842,741 | 7/1958 | Simkins | 324/156 X |
| 3,555,420 | 1/1971 | Schwartz | 324/149 |
| 3,946,613 | 3/1976 | Silver | 73/431 X |
| 4,259,635 | 3/1981 | Triplett | 324/156 X |
| 4,860,901 | 8/1989 | Hochreuther et al. | 73/431 X |

FOREIGN PATENT DOCUMENTS 0106467  4/1984  European Pat. Off. .............. 73/431

Primary Examiner—Kenneth Wieder
Assistant Examiner—Robert W. Mueller
Attorney, Agent, or Firm—Varndell Legal Group

[57] ABSTRACT

An electrical gauge structure capable of conveniently placing thereon one or two measuring bars is provided. The structure includes a housing, a fixing piece cooperating with the housing to define therebetween a clearance, and two retaining pieces provided on two sides of the fixing piece and limitedly slidably guided in the clearance so that when the retaining pieces are outwardly slid, they can position thereon the measuring bars.

8 Claims, 5 Drawing Sheets

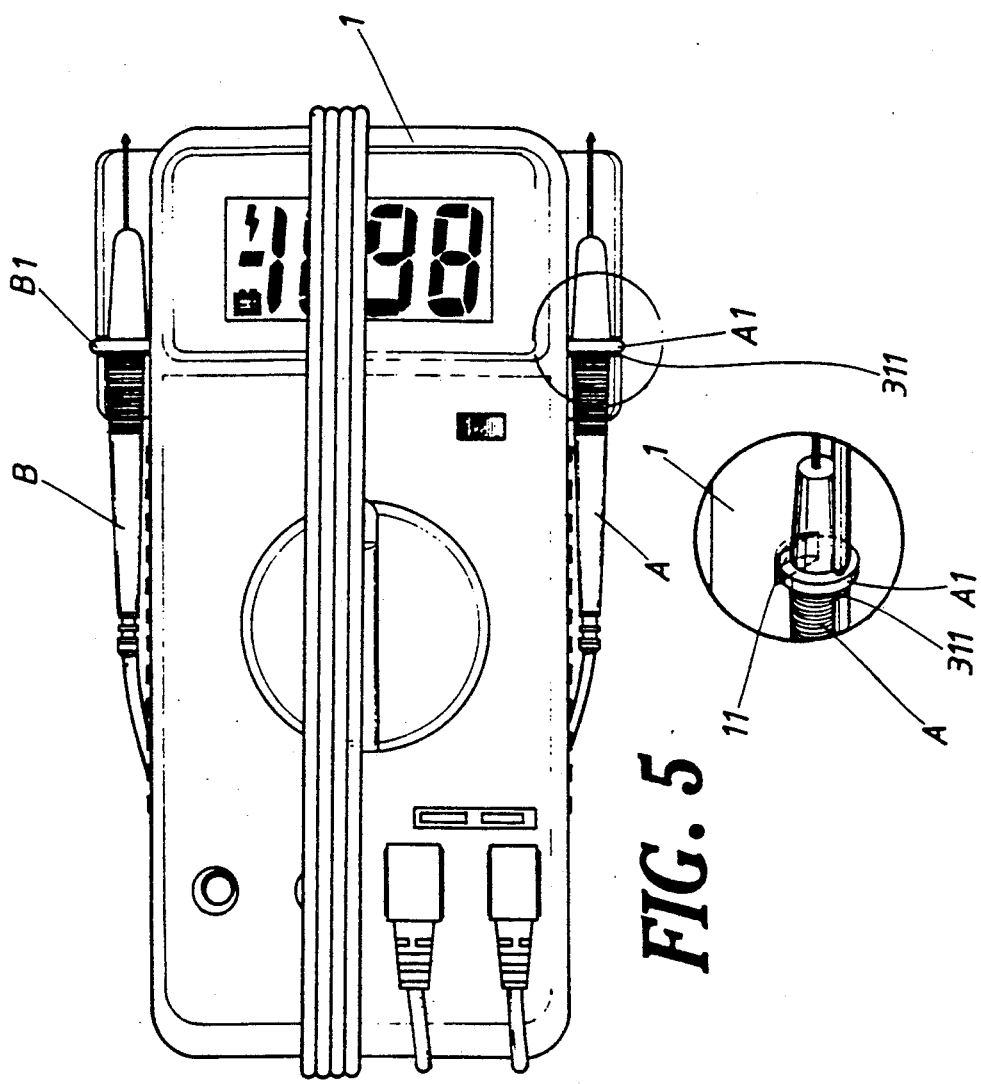

ELECTRICAL GAUGE STRUCTURE

BACKGROUND OF THE INVENTION

The present invention relates to an electrical gauge and, more particularly, to a structure therefor.

Electrical gauges are conventionally categorized into the analog and digtal types, either of which can conveniently be placed on a work table for use, but which are inconvenient when used in, e.g., a car garage or a machine house, since there always is not a suitable place for resting the gauges. Frequently, when the user places the gauge on a supposedly suitable place with his two hands respectively holding the two measuring bars or probes, upon moving the measuring bars, his action is inadvertently translated to the gauge which then falls on the ground and becomes damaged. Also, with an analog type gauge, if the gauge is placed in a position which does not permit the user to observe the indicating pointer correctly, the user may obtain an inaccurate reading.

SUMMARY OF THE INVENTION

It is therefore an object of the present invention to provide an electrical gauge structure which is capable of allowing the user to conveniently hold both the body housing and the measuring bar.

According to the present invention, an electrical gauge structure includes a body housing, a fixing piece cooperating with the housing for defining a clearance therebetween having two symmetrical protuberances, and two retaining piece limitedly slideable within the clearance and each of which has two positioning holes engageable with one of the protuberances so that the one protuberance and the two positioning holes cooperate to define a slidable range for the each retaining piece.

The present invention may best be understood through the following description with reference to the accompanying drawings, in which:

BRIEF DESCRIPTION OF THE DRAWING

FIG. 5 is a top view showing an electrical gauge shown in FIG. 4; and

FIG. 5A is an enlarged perspective view showing the circled area in FIG. 5.

DETAILED DESCRIPTION OF THE PREFERRED EMBODIMENT

Figure 1:
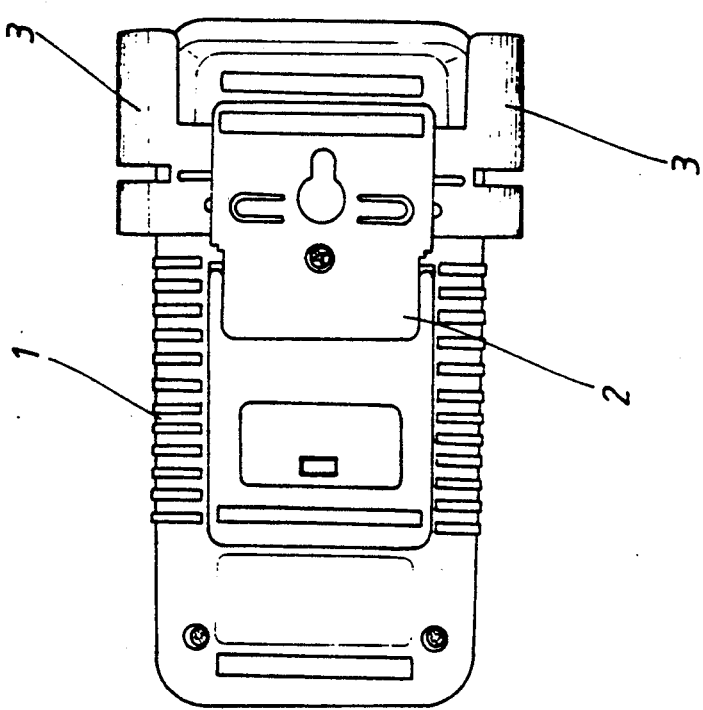
FIG. 1 is a bottom view of a preferred embodiment of an electrical gauge structure according to the present invention.
Figure 2:
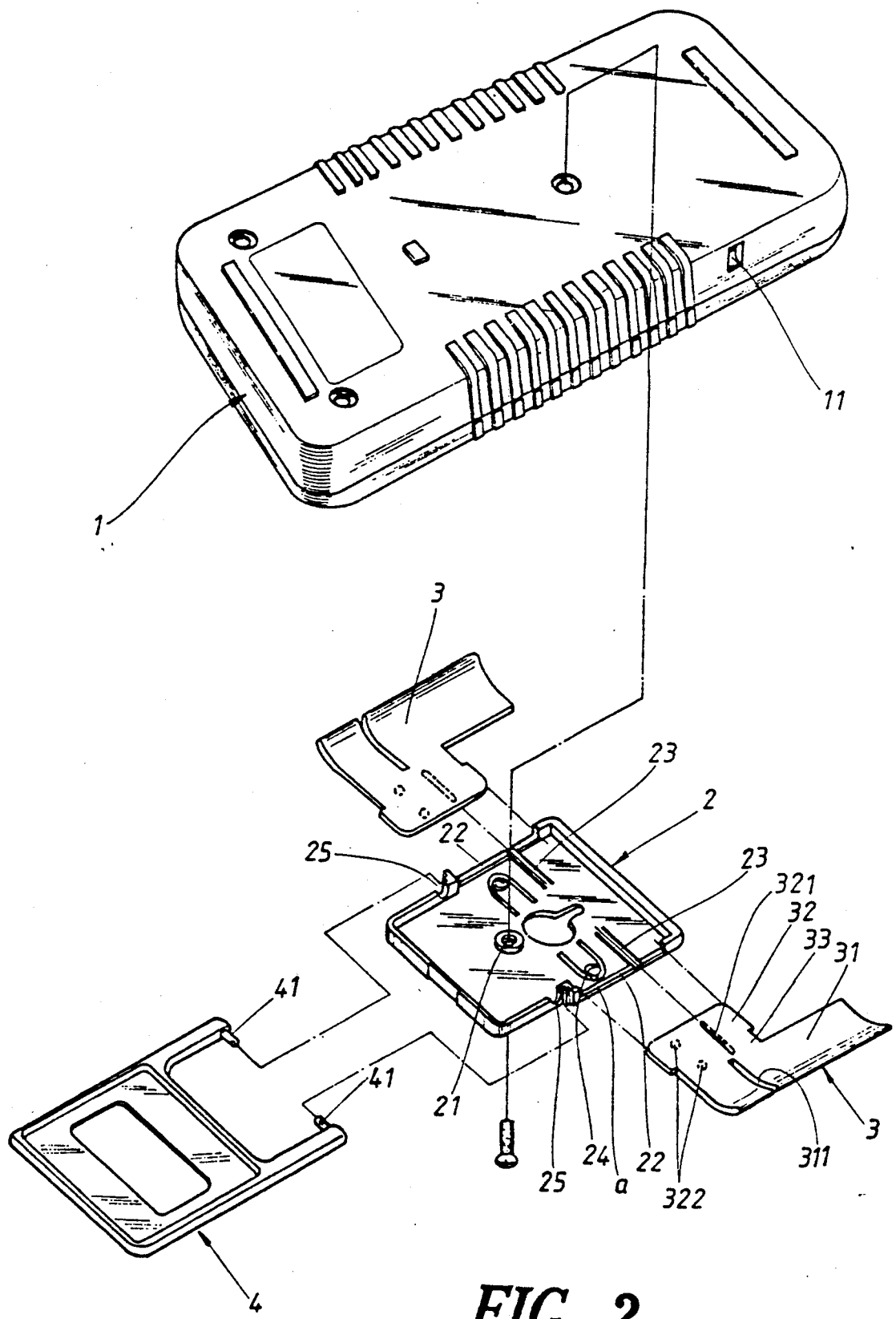
FIG. 2 is an exploded view of a gauge structure in FIG. 1.

Referring now to FIGS. 1 & 2, an electrical gauge structure according to the present invention includes a body housing 1 having two opposite side grooves 11, a fixing piece 2, two retaining pieces 3, and a supporting piece 4 having two end pivots 41. Fixing piece 2 is peripherally flanged, and includes a central threaded hole 21 by which piece 2 can be fastened to and under housing 1 and cooperates with housing 1 to define therebetween a clearance partly receiving therein retaining pieces 3, two side indentations 22 for receiving retaining pieces 3, two grooves 23 respectively perpendicular to indentations 22, two protuberances 24, two side notches 25 respectively pivotally receiving therein end pivots 41 so that housing 1 can be inclinedly supported by supporting piece 4, and two excavated through portions or U-shaped slots are provided respectively adjacent the protuberances 24 to enhance the flexibility of fixing piece 2 at and near the protuberances 24.

Retaining pieces 3 are respectively provided on two sides of fixing piece 2. Each piece 3 includes a first portion 31, a second portion 32 and a neck portion 33 positioned therebetween. The first portion 31 is upwardly curved in the longitudinal direction of housing 1 and has a groove 311 provided in the transverse direction of housing 1 and corresponding to one of side grooves 11. Portions 32 & 33 include a bottom bar protrusion 321 capable of sliding in one of grooves 23 and two bottom positioning holes 322 engageable with one of protuberances 24 so that the one protuberance 24 and positioning holes 322 cooperate to define a slidable range for each piece 3 in the transverse direction. With respect to the slidable range for piece 3, the neck portion 33 can freely pass through a respective indentation 22, whereas the second portion 32 is slidable only in the clearance and cannot pass through the indentation 22.

Figure 3:
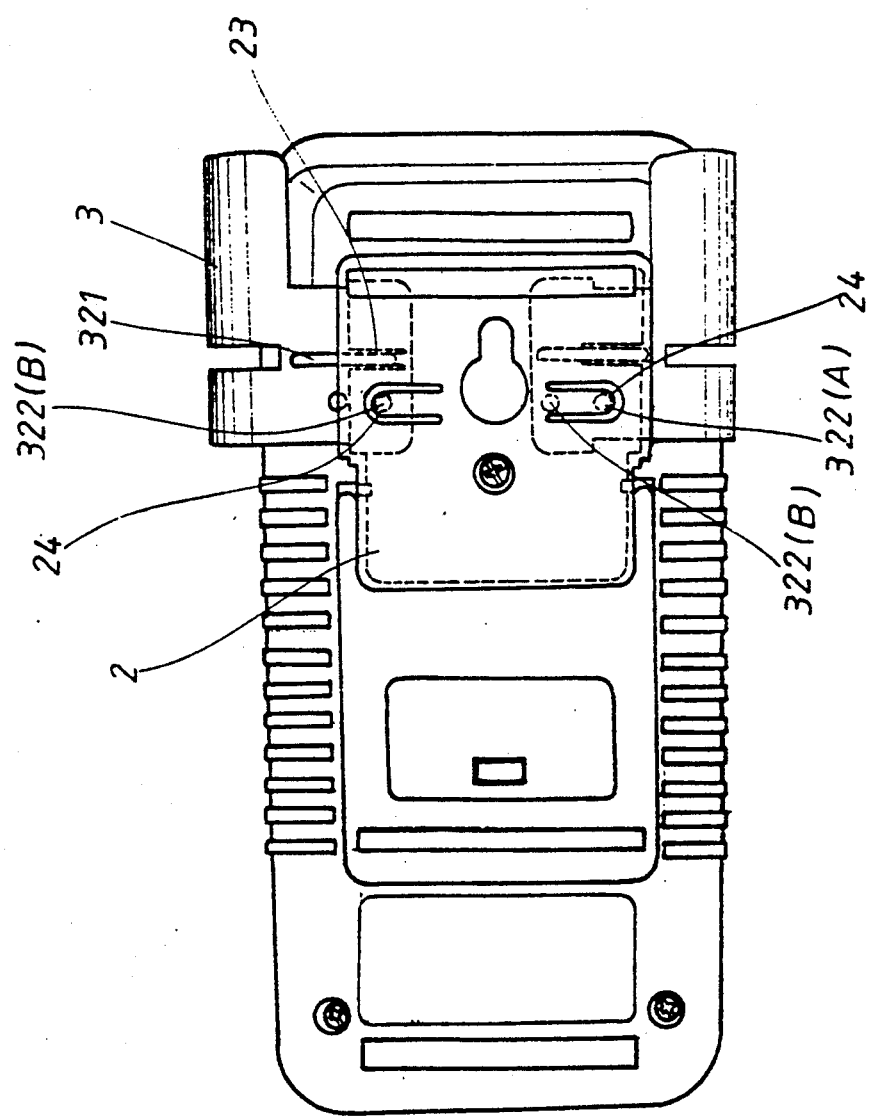
FIG. 3 is further a bottom view of a gauge structure in FIG. 1, better showing the retaining pieces.
Figure 4:
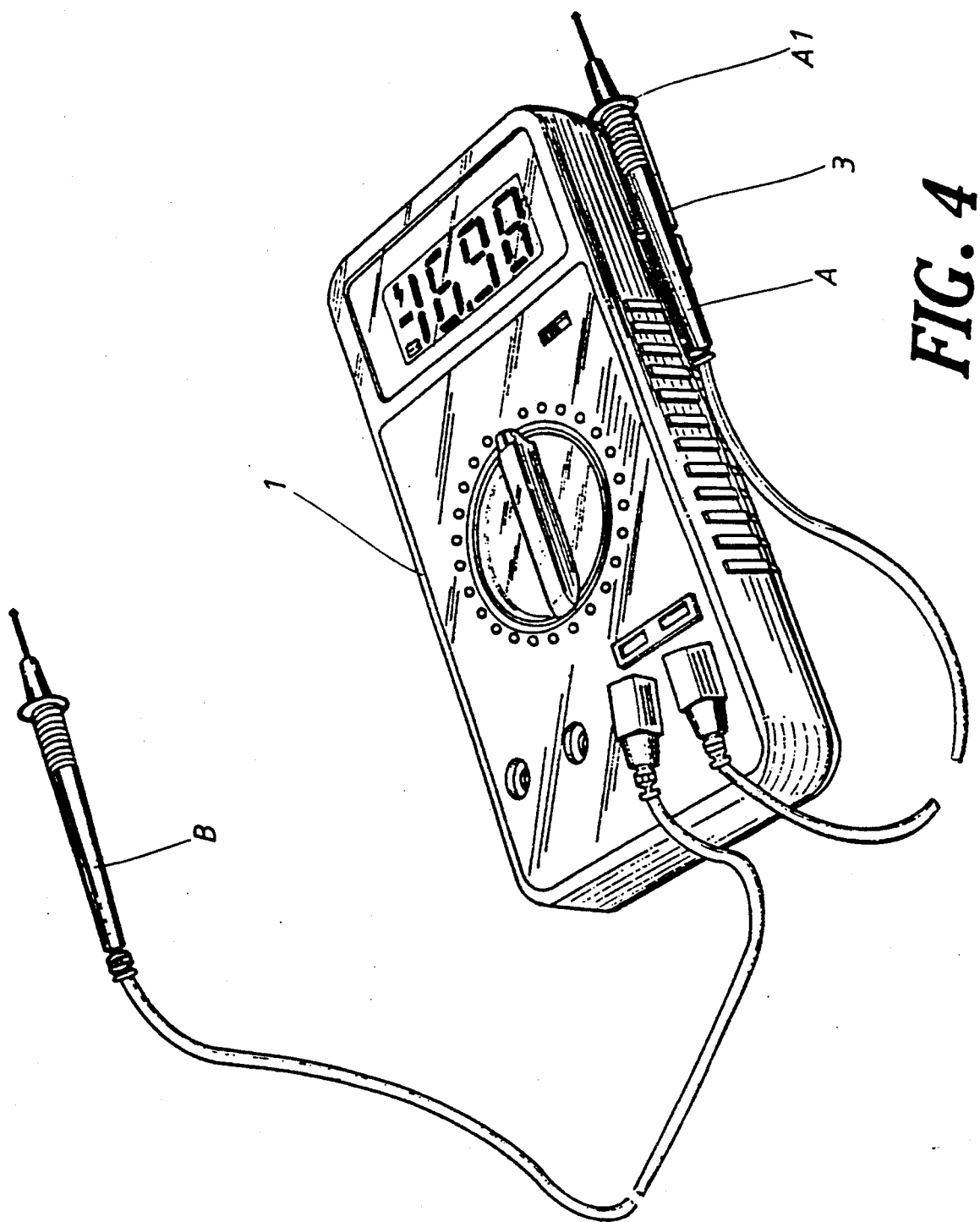
FIG. 4 is a perspective view showing an electrical gauge embodying the principle of the present invention.

As shown in FIG. 3, if the top retaining piece 3 is upwardly or outwardly pulled, top piece 3 will guidedly move by the provision of bar protrusion 321 and groove 23, and protuberance 24 will engage with positioning hole 322 (B) instead of positioning hole 322 (A) through the provision of the excavated through portion or U-shaped slots imparting a flexibility to fixing piece 2. Thus, as shown in FIG. 4, the pulled piece 3 can cooperate with body housing 1 to retain thereon a measuring bar A having an annular flange A1 so that if there is not a suitable place for placing the electrical gauge, the user can conveniently hold together body housing 1 and measuring bar A with his one hand and can grip another measuring bar B with his other hand to thus obviate the shortcomings encountered by the prior art.

As shown in FIGS. 5 & 5A, in storage, the electrical wires of measuring bars A, B can be wound around body housing 1 and annular flanges A1, and B1 of bars A, B can respectively be retained in grooves 311 and 11 so that the electrical gauge can thus be conveniently stored and/or carried.

What I claim is:

1. An electrical gauge structure comprising:
   a housing,
   a fixing piece having two symmetrical protuberance and attached to a bottom of said housing and cooperating with said housing to form two slots, one slot on each side of said housing,
   two retaining pieces each having a first portion extending over a longitudinal portion of said housing and curved in a direction transverse to said housing for holding an item between said housing and said retaining piece in a closed position and for permitting removal of said item therefrom in an open position, a second portion received in one of said two slots, said second portion including two holes alternatingly engaging with one of said two protuberances for defining a transverse sliding range of said second portion within said one slot between said open and closed positions.

2. An electrical gauge structure accordingly to claim 1, wherein said fixing piece includes two transversely extending indentations and two grooves on its longitudinal edges for receiving said second portion of said retaining pieces, and each said retaining piece has a bar protrusion received in and cooperation with one of said two transverse indentations for guiding said retaining piece throughout its sliding movement.

3. An electrical gauge structure according to claim 1, wherein said fixing piece includes two U-shaped slots respectrively adjacent said two protuberances for enhancing the flexibility of said fixing piece about the protuberances and facilitating action between said protuberances and said holes when said fixing piece is slid between said open and close positions.

4. An electrical gauge structure according to claim 1, wherein said first portion of each said retaining piece has a groove in its transverse direction.

5. An electrical gauge structure according to claim 4, wherein said housing includes two matching side grooves corresponding to said grooves of said retaining pieces.

6. An electrical gauge structure according to claim 5, wherein said item includes a flange removably receivable in said groove of said retaining pieces and in one of said matching grooves of said housing.

7. An electrical gauge structure according to claim 4, wherein said item includes a flange removably receivable in said groove of said retaining piece.

8. An electrical gauge structure according to claim 1, comprising of a supporting piece pivotedly connected to said fixing piece for inclinedly supporting said housing.

* * * * *